United States Patent
Sano et al.

(10) Patent No.: US 8,134,231 B2
(45) Date of Patent: Mar. 13, 2012

(54) SEMICONDUCTOR CHIP AND SEMICONDUCTOR DEVICE

(75) Inventors: Hikari Sano, Hyogo (JP); Yoshihiro Tomita, Osaka (JP); Takahiro Nakano, Kyoto (JP)

(73) Assignee: Panasonic Corporation, Osaka (JP)

( * ) Notice: Subject to any disclaimer, the term of this patent is extended or adjusted under 35 U.S.C. 154(b) by 405 days.

(21) Appl. No.: 12/348,543

(22) Filed: Jan. 5, 2009

(65) Prior Publication Data

US 2009/0189276 A1    Jul. 30, 2009

(30) Foreign Application Priority Data

Jan. 30, 2008  (JP) .................. 2008-018641

(51) Int. Cl.
*H01L 21/302*   (2006.01)
*H01L 21/461*   (2006.01)
(52) U.S. Cl. .............. 257/706; 257/707; 257/622
(58) Field of Classification Search .......... 257/706, 257/707, 622, 778
See application file for complete search history.

(56) References Cited

U.S. PATENT DOCUMENTS

| | | | | |
|---|---|---|---|---|
| 5,003,357 A * | 3/1991 | Kim et al. | ............ | 257/98 |
| 5,065,281 A * | 11/1991 | Hernandez et al. | ............ | 361/709 |
| 5,210,599 A * | 5/1993 | Kawai | ............ | 257/534 |
| 5,378,926 A * | 1/1995 | Chi et al. | ............ | 257/767 |
| 5,438,212 A | 8/1995 | Okaniwa | | |
| 5,731,067 A | 3/1998 | Asai et al. | | |
| 6,507,115 B1 * | 1/2003 | Hofstee et al. | ............ | 257/777 |
| 6,611,055 B1 * | 8/2003 | Hashemi | ............ | 257/706 |
| 7,649,249 B2 * | 1/2010 | Noguchi | ............ | 257/686 |
| 7,679,176 B2 * | 3/2010 | Asano et al. | ............ | 257/686 |
| 7,724,536 B2 * | 5/2010 | Usui et al. | ............ | 361/761 |
| 7,782,624 B2 * | 8/2010 | Fujii | ............ | 361/720 |
| 2005/0056903 A1 | 3/2005 | Yamamoto et al. | | |
| 2006/0131732 A1 * | 6/2006 | Nah et al. | ............ | 257/706 |
| 2007/0052080 A1 * | 3/2007 | Chen | ............ | 257/686 |

FOREIGN PATENT DOCUMENTS

JP    2002-334968    11/2002

* cited by examiner

*Primary Examiner* — S. V. Clark
(74) *Attorney, Agent, or Firm* — McDermott Will & Emery LLP

(57) ABSTRACT

A semiconductor chip, including: a substrate including an front surface; an integrated circuit formed on the front surface and including a plurality of semiconductor elements; and a heat-radiating plug formed in a region of the substrate corresponding to at least one of the semiconductor elements. The heat-radiating plug is made of a material having a thermal conductivity greater than that of the substrate formed in a non-penetrating hole having its opening on a reverse surface of the substrate.

21 Claims, 4 Drawing Sheets

US 8,134,231 B2

SEMICONDUCTOR CHIP AND SEMICONDUCTOR DEVICE

CROSS REFERENCE TO RELATED APPLICATION

This application claims priority under 35 U.S.C. §119 on Patent Application No. 2008-018641 filed in Japan on Jan. 30, 2008, the entire contents of which are hereby incorporated by reference.

BACKGROUND OF THE INVENTION

The present disclosure relates to a semiconductor chip and a semiconductor device and, more particularly, to a semiconductor chip including a heat-generating element such as an amplifier element, and a semiconductor device using the same.

Recent electronic devices often use a semiconductor chip including various semiconductor elements integrated therein in order to thereby increase the productivity or reduce the overall size. For example, such a semiconductor chip includes a semiconductor substrate, and an integrated circuit including a plurality of semiconductor elements formed on the front surface of the semiconductor substrate. Such a semiconductor chip includes a connection electrode on the reverse surface for the connection with a circuit board, and the connection electrode and the integrated circuit are electrically connected together via, for example, a penetrating plug running completely through the semiconductor substrate (see, for example, United States Patent No. 2005/0056903).

Such a semiconductor chip can be mounted onto a package whose size is substantially equal to that of the chip size, with the front surface facing up. It is particularly advantageous in, for example, reducing the size of a semiconductor device such as a solid-state image sensing device.

SUMMARY OF THE INVENTION

However, a conventional semiconductor chip as described above has the following problem. With semiconductor devices, there are demands not only for a reduction in size but also for an increase in performance. Therefore, it is required to form a plurality of elements that pass large currents therethrough, such as amplifier elements, in a semiconductor chip. Elements that pass large currents therethrough generate large amounts of heat, thereby increasing the temperature of the semiconductor chip.

The amount of leak current occurring at the pn junction of a semiconductor substrate under a reverse bias increases as the temperature increases. The leak current is caused by free electrons or free positive holes that are thermally excited in the depletion layer at the pn junction of the semiconductor substrate. The amount of leak current increases by a factor of about 2 for a 10° C. temperature increase of the semiconductor substrate. Thus, the amount of leak current when the temperature of the semiconductor substrate is 125° C. is $2^{10}$ times that at 25° C.

Such an increase in the leak current causes an erroneous operation of a semiconductor device. Therefore, it is necessary to effectively radiate heat from the semiconductor chip. With a conventional semiconductor chip, however, heat cannot be radiated except via the semiconductor substrate, failing to realize an efficient heat radiation and thus deteriorating the operation reliability.

The present invention solves the problem in the prior art and realizes a semiconductor chip capable of efficiently radiating heat from the reverse surface of the semiconductor substrate.

A semiconductor chip of the present invention includes a heat-radiating plug formed in a region under a semiconductor element.

Specifically, a semiconductor chip of the present invention includes: an integrated circuit formed on a front surface of a substrate and including a plurality of semiconductor elements; and a heat-radiating plug formed in a region of the substrate corresponding to at least one of the semiconductor elements. The heat-radiating plug is made of a material having a thermal conductivity greater than that of the substrate formed in a non-penetrating hole having its opening on a reverse surface.

The semiconductor chip of the present invention includes the heat-radiating plug, whereby it is possible to efficiently transmit heat generated from the semiconductor element to the reverse surface of the substrate. By connecting the heat-radiating plug to a heat-radiating portion of a circuit board, it is possible to efficiently radiate heat and to thereby suppress the temperature increase of the semiconductor chip. Thus, it is possible to improve the reliability of the semiconductor chip. Since the interval between the semiconductor elements can be reduced, it is also possible to reduce the area of the semiconductor chip. Since the heat-radiating plug is electrically insulated from the integrated circuit, the heat-radiating plug will not affect the operation of the integrated circuit.

DETAILED DESCRIPTION OF THE INVENTION

Figure 1:
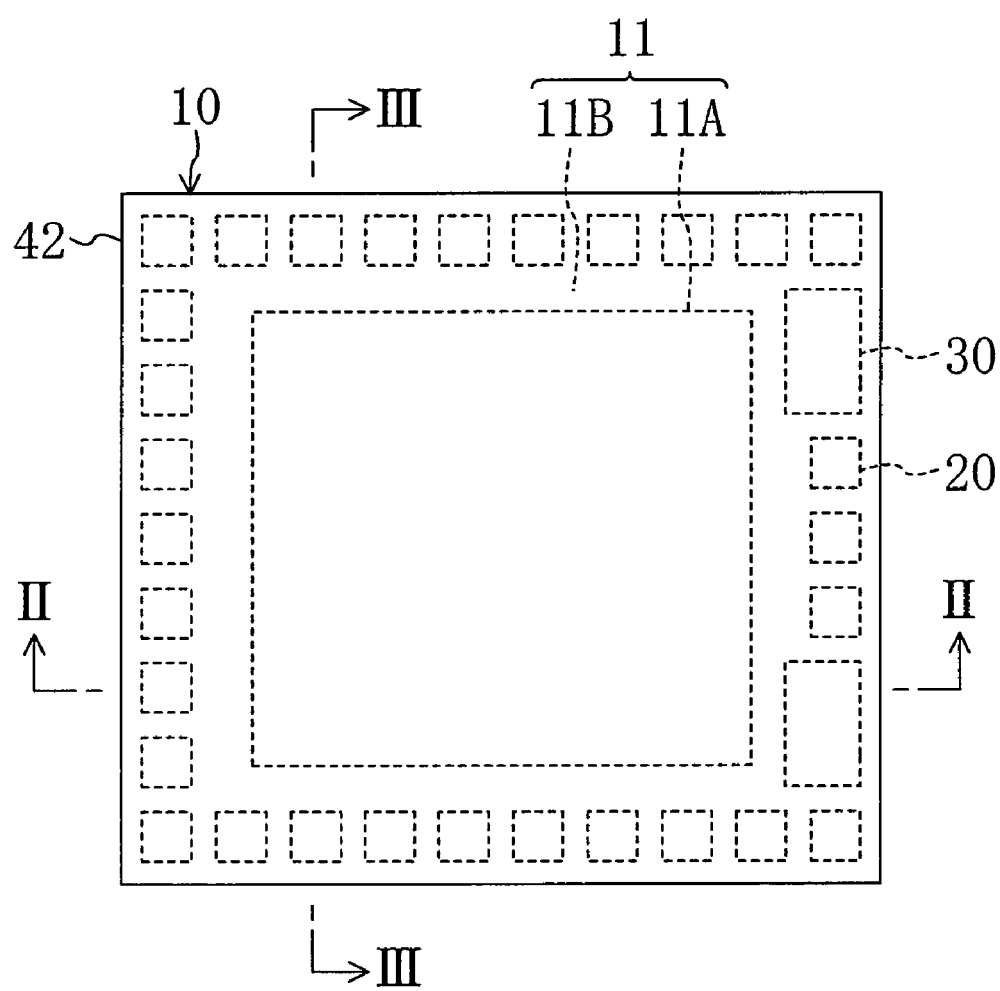
FIG. 1 is a plan view showing a semiconductor chip according to an embodiment of the present invention.
Figure 2A:
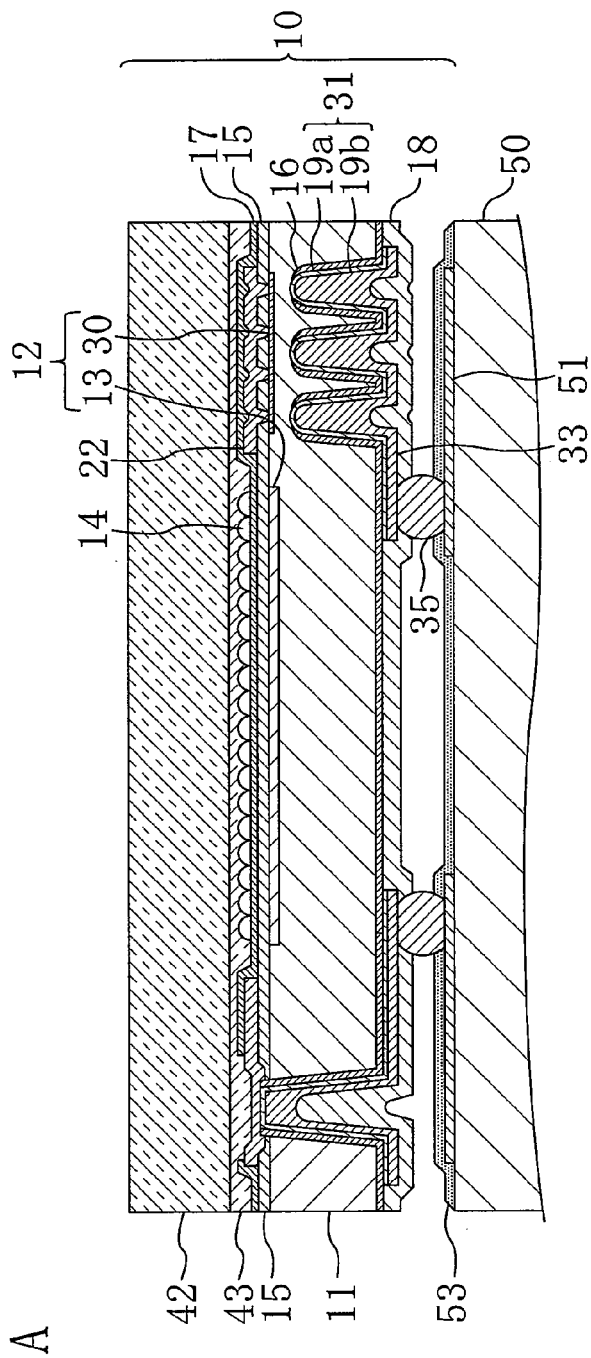
FIG. 2A is a cross-sectional view taken along line II-II in FIG. 1, showing a semiconductor chip according to an embodiment of the present invention.
Figure 2B:
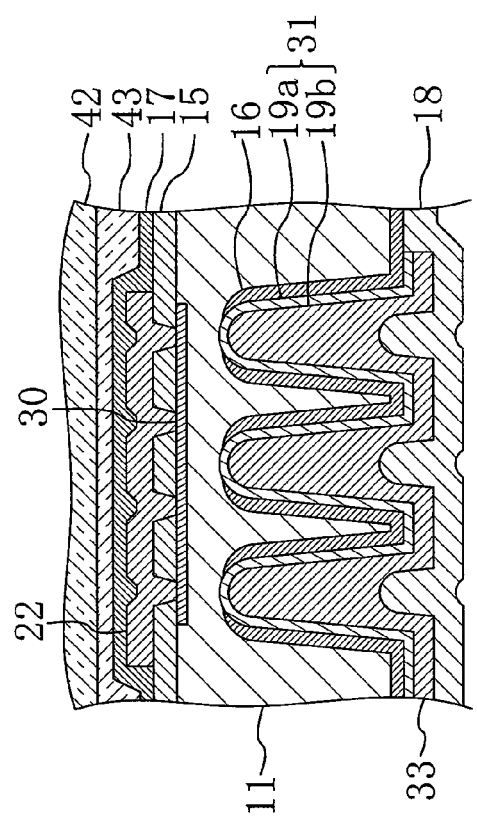
FIG. 2B is an enlarged cross-sectional view showing a part of the structure shown in FIG. 2A.
Figure 3A:
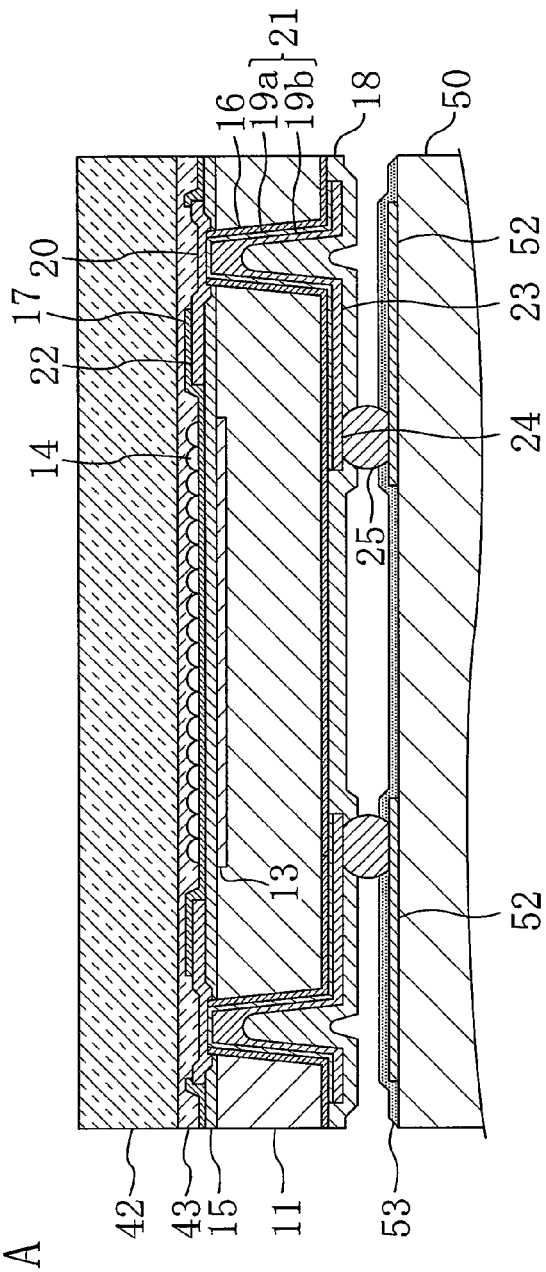
FIG. 3A is a cross-sectional view taken along line III-III in FIG. 1, showing a semiconductor chip according to an embodiment of the present invention.
Figure 3B:
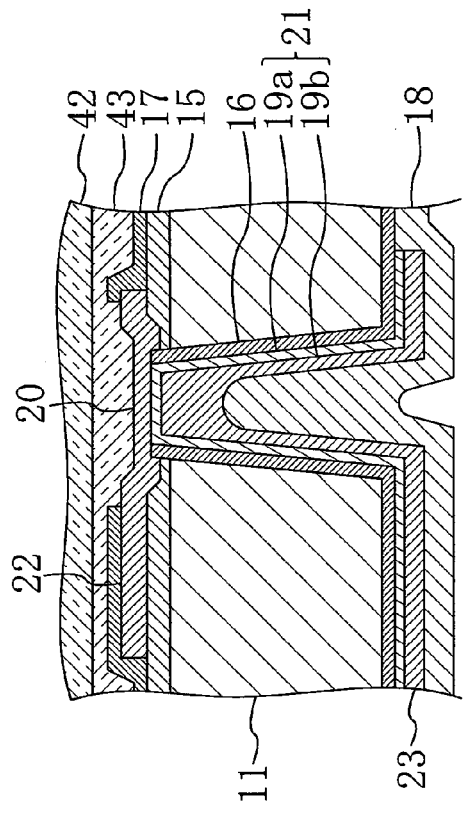
FIG. 3B is an enlarged cross-sectional view showing a part of the structure shown in FIG. 3A.

An embodiment of the present invention will be described with reference to the drawings. FIGS. 1 to 3B show a semiconductor chip according to an embodiment of the present invention, wherein FIG. 1 is a plan view, FIGS. 2A and 2B are cross-sectional views taken along line II-II in FIG. 1, and FIGS. 3A and 3B are cross-sectional views taken along line III-III in FIG. 1. FIG. 2B is an enlarged view of a part of the structure shown in FIG. 2A, and FIG. 3B is an enlarged view of a part of the structure shown in FIG. 3A.

Referring to FIGS. 1, 3A and 3B, an integrated circuit 12 including a plurality of semiconductor elements is formed on the front surface (i.e., the surface on which semiconductor elements are formed) of a silicon substrate 11. The integrated circuit of the present embodiment is an image-sensing circuit including a plurality of light-receiving elements 13 formed in a light-receiving element region 11A provided in a central portion of the substrate 11. A peripheral region 11B is provided around the light-receiving element region 11A, and peripheral elements for driving the light-receiving element 13, such as amplifier elements 30, are provided in the peripheral region 11B.

Some of the peripheral elements formed in the peripheral region 11B are amplifier elements, which generate large amounts of heat. For example, the present embodiment uses the amplifier elements 30 of a floating-diffusion ("FD") type. Heat-radiating plugs 31 are formed in a region of the substrate 11 under the amplifier element 30. The heat-radiating plug 31 is made of a metal material and formed in a non-penetrating hole in the substrate 11.

The heat from the amplifier element 30 is transmitted into the substrate 11. With the thermal conductivity of the silicon substrate 11 being only about 160 W/m·K, heat cannot be radiated and the temperature of the substrate 11 increases, even if the reverse surface of the substrate 11 is connected to a heat-radiating portion. An increase in the temperature of the substrate 11 may result in variation in characteristics of the light-receiving elements 13 to invite deviation of the threshold value thereof from the standard value. If the threshold value is deviated therefrom, a high-level value is output at an amount of light at which a low-level value should be output inherently to cause a failure, such as inverted display of white and black in the image.

In the semiconductor chip of the present embodiment, the heat-radiating plugs 31, made of a metal, are formed in a region under the amplifier element 30 generating a large amount of heat. For example, the thermal conductivity of copper is 390 W/m·K, being twice or more as high as that of silicon. Therefore, heat from the amplifier element 30 is transmitted through the heat-radiating plugs 31 to the reverse surface of the substrate 11. If the heat-radiating plugs 31 are connected to the heat-radiating region of a circuit board 50 via a metal layer 33 and a heat-radiating terminal 35, heat generated at the amplifier element 30 can be efficiently radiated.

In view of the heat-radiating efficiency, the upper ends of the heat-radiating plugs 31 are as close as possible to the amplifier element 30. However, if the heat-radiating plug 31 made of a metal is placed too close to the amplifier element 30, there will be an electrical contact therebetween, thus affecting the operation of the integrated circuit. Where the amplifier element 30 is an FD section, for example, there should be an interval of 5 μm to 150 μm, more preferably 15 μm to 50 μm, between the position to which the depletion layer in the substrate 11 is expanded by the operation of the FD section and the upper ends of the heat-radiating plugs 31. Then, the heat-radiating plug 31 is completely insulated from the amplifier element 30, thereby not affecting the operation of the integrated circuit.

In the present embodiment, the heat-radiating plug 31 is formed by a first metal film 19A being a layered film of titanium (Ti) and copper (Cu), and a second metal film 19B being a film of Cu. With such a structure, the thermal conductivity of the heat-radiating plug 31 can be improved. With an improved adhesion with the insulating film, the heat-radiating plug 31 is less likely to peel off even if an insulating film 16 is formed in the non-penetrating hole forming the heat-radiating plug 31. The material is not limited to any particular material as long as it has a thermal conductivity greater than a semiconductor substrate. Further, the heat-radiating plug 31 may be not necessarily a layered film.

In the present embodiment, the insulating film 16 covers the side wall of the non-penetrating hole and is formed between a portion of the heat-radiating plug 31 except the upper end part thereof and the substrate 11. The insulating film 16 has a heat conductivity smaller than the heat-radiating plug 31. For this reason, the heat from the side wall of the heat-radiating plug 31 to the substrate 11 is less diffused. As a result, the heat transmitted to the heat-radiating plug 31 is less diffused again to the substrate 11 but is transmitted efficiently to the reverse surface of the substrate 11.

The upper end part of the heat-radiating plug 31 is not covered with the insulating film 16 and is in contact with the substrate 11. Accordingly, the insulating film 16 less invites degradation of conduction of heat generated at the amplifier element 30 formed above the heat-radiating plug 31 to the heat-radiating plug 31. This leads to more efficient heat release outside the substrate 11 than the case where a material, for example, a metal is filled directly with the non-penetrating hole, resulting in that the thermal distribution in the substrate 11 except the vicinity of the amplifier element 30 can be maintained more uniformly. Hence, characteristic variation and characteristic unevenness of the integrated circuit, which are caused due to an influence of non-uniform thermal distribution in the substrate, can be reduced. Also, with the insulating film 16 formed on the side wall of the non-penetrating hole, the heat-radiating plugs 13 can be formed by the same process as that for a penetrating plug 21 to be described later.

Referring to FIGS. 2A and 2B, the heat-radiating plugs 31 are connected to a heat-radiating land 51 formed on the circuit board 50 via the metal layer 33 and the heat-radiating terminal 35. The heat-radiating terminal 35 may be a solder ball, a resin ball with a conductive coating thereon, a stud bump, or the like. A solder ball may be of any suitable composition such as tin-silver-copper, tin-silver-bismuth or zinc-bismuth. The metal layer 33 may be connected directly to the circuit board 50 without using the heat-radiating terminal 35.

In FIGS. 2A and 2B, the insulating film 16 is formed between the metal layer 33 and the reverse surface of the substrate 11. This suppresses diffusion of heat from the metal layer 33 to the substrate 11, thereby enabling more effective heat radiation toward the circuit board 50.

Figure 4A:
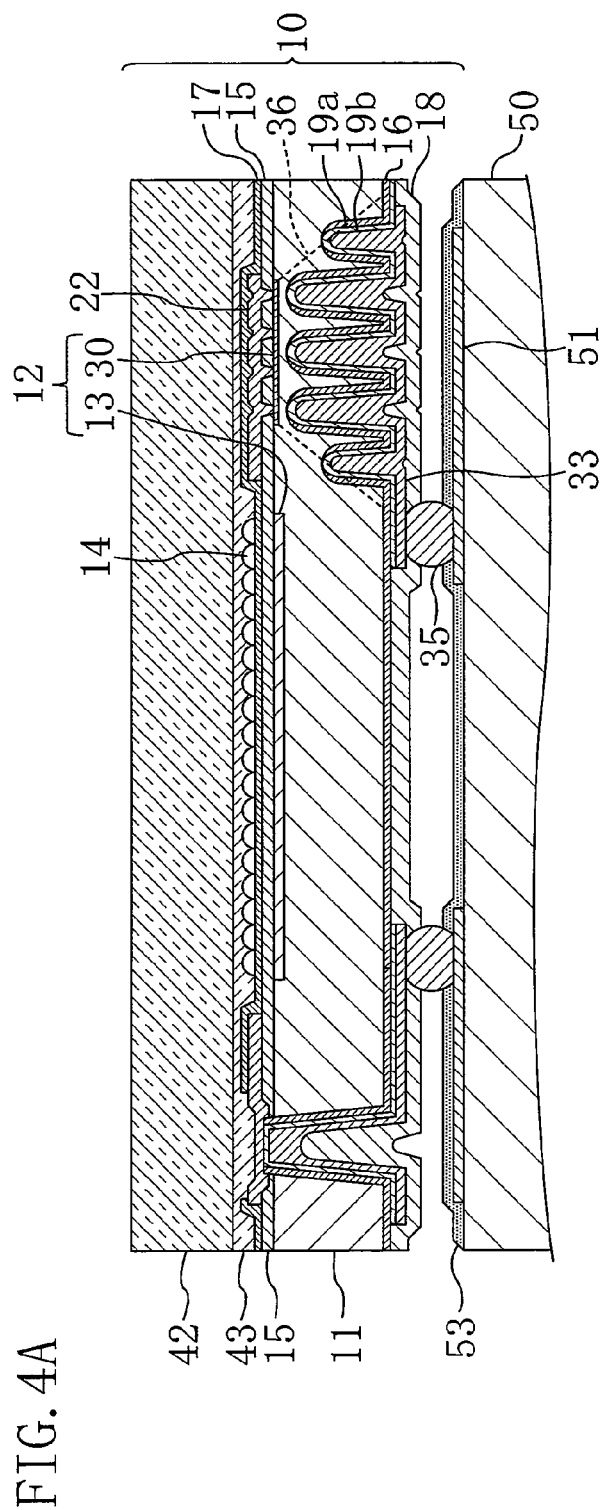
FIG. 4A is a cross-sectional view taken along line II-II in FIG. 1, showing a semiconductor chip according to an embodiment of the present invention.
Figure 4B:
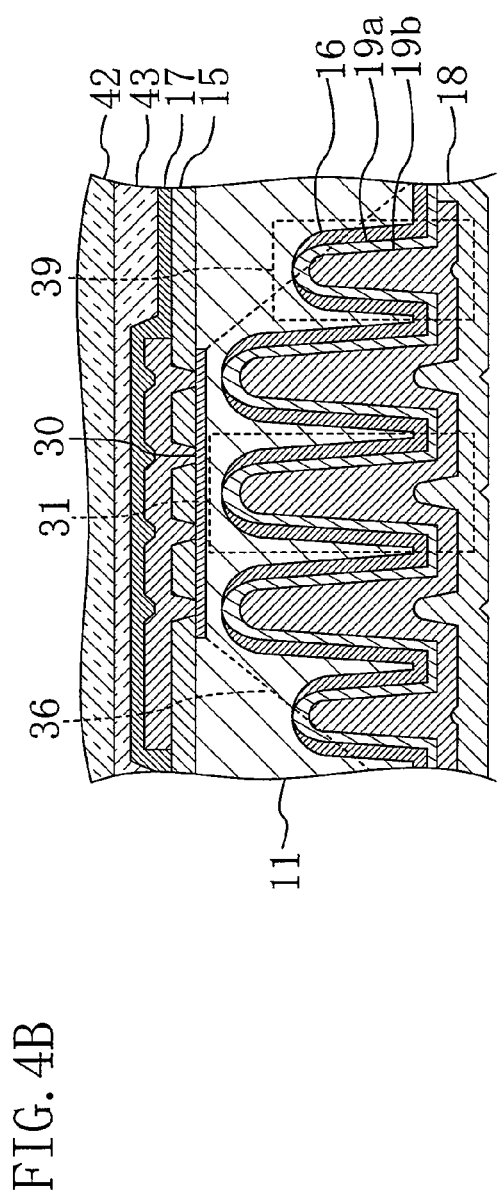
FIG. 4B is a cross-sectional view showing a part of the structure shown in FIG. 4A.

While there are a plurality of heat-radiating plugs 31 in the illustrated example, there may be only one heat-radiating plug 31 as long as a sufficient heat-radiating effect can be obtained. The heat-radiating plugs 31 may be located at any suitable position as long as heat from the amplifier element 30 can be radiated efficiently, and the position is not limited to directly under the amplifier element 30. Moreover, there may be auxiliary heat-radiating plugs 39 in addition to the heat-radiating plugs 31, as shown in FIGS. 4A and 4B. The auxiliary heat-radiating plugs 39 may be formed around the heat-radiating plugs 31. The height of the auxiliary heat-radiating plugs 39 may be smaller than that of the heat-radiating plugs 31 so that the plugs stand in conformity with a boundary line 36 of heat flow. In this way, the heat-radiating plugs 31, the auxiliary heat-radiating plugs 39 and the penetrating plugs 21 can be formed by the same process as will be described later.

Next, a structure for extracting the input terminal and the output terminal of the integrated circuit 12 to the reverse surface of the substrate 11 will be described. This structure may be a known structure. For example, a connection electrode 20 is formed on the peripheral region 11B, and a reverse surface electrode 24 is formed on the reverse surface of the substrate 11. The connection electrode 20 is electrically connected to the integrated circuit 12 via an internal wiring 22, and is electrically connected to the reverse surface electrode 24 via the penetrating plug 21 running completely through the substrate 11 and a reverse surface wiring 23 formed on the reverse surface of the substrate 11. The reverse surface electrode 24 may be connected to a connection land 52 formed on the circuit board 50 via a connection terminal 25.

Referring to FIGS. 3A and 3B, the connection electrode 20 and the internal wiring 22 are insulated from the substrate 11 by an insulating film 15. The penetrating plug 21, the reverse surface wiring 23 and the reverse surface electrode 24 are insulated from the substrate 11 by the insulating film 16. The insulating film 15 may be a vapor-deposited film of a silicon oxide material such as tetraethoxysilane (TEOS) or fused silica glass (FSG), or a film of a low-k material such as carbon-containing silicon oxide (SiOC). Two or more of these films may be combined together. The insulating film 16 may be, for example, a vapor deposition film such as a silicon oxide film or a thermally oxidized film. The internal wiring 22 and the reverse surface wiring 23 may each be a multi-layer wiring. Any wiring may be embedded in the insulating film 15 for connecting peripheral elements, such as the light-receiving element 13, the amplifier element 30, and the like.

The penetrating plug 21 is made of a metal material and formed in a penetrating hole in the substrate 11. The penetrating plugs 21 and the heat-radiating plugs 31 can be formed at the same time as follows.

For the process of etching the substrate 11 using a mask, an opening to be a non-penetrating hole is made with a smaller diameter than an opening to be a penetrating hole. With a reactive ion etching (RIE) process, for example, the etching rate in a smaller-diameter opening is lower than that in a larger-diameter opening. As a result, a larger-diameter opening becomes a penetrating hole, and a smaller-diameter opening becomes a non-penetrating hole.

Then, an insulating film such as a silicon oxide film is formed across the entire reverse surface of the substrate 11. Then, a portion of the silicon oxide film that is exposed through the penetrating hole and covering the surface of the connection electrode 20, and a portion of the silicon oxide film that is covering the upper end portion of the non-penetrating hole are removed.

Then, the first metal film 19A being a layered film of Ti and Cu and the second metal film 19B being a film of Cu are formed in portions to be the penetrating holes, the non-penetrating holes, and the surrounding electrodes and wiring. The first metal film 19A can be formed as a thin film obtained by successively layering Ti and Cu by sputtering, vapor deposition, or the like. The second metal film 19B can be obtained by forming a thick film by electrolytic plating, or the like. Thus, the penetrating plug 21, the heat-radiating plug 31, the reverse surface wiring 23, the reverse surface electrode 24 and the metal layer 33 are formed.

The first metal film 19A being a layered film of Ti and Cu satisfies various requirements, i.e., the adhesion with the insulating film 16, the linear expansion matching with the substrate 11, the electrical conductivity as the penetrating plug 21, and the thermal conductivity as the heat-radiating plug 31. The second metal film 19B being a film of Cu is satisfactory in terms of the electrical conductivity and the thermal conductivity. However, the present invention is not limited to these materials.

The auxiliary heat-radiating plug 39 can be obtained by forming an opening in a non-penetrating hole formation region, where the auxiliary heat-radiating plug 39 is to be formed, with the opening having a smaller diameter than that of an opening in a penetrating hole formation region, where the heat-radiating plug 31 is to be formed. Then, there is formed a non-penetrating hole having a smaller height than the heat-radiating plug 31.

Referring to FIGS. 2B and 3B, where the penetrating plugs 21 and the heat-radiating plugs 31 are formed at the same time, a large depression is usually formed on the surface of the second metal film 19B in the penetrating plug 21. However, the formation of such a depression does not affect the conductivity of the penetrating plug 21. Since the diameter of the non-penetrating hole is smaller than the diameter of the penetrating hole, a depression formed in the heat-radiating plug 31 is smaller than that formed in the penetrating plug 21. Thus, the thermal conductivity of the heat-radiating plug 31 is not decreased.

A depression can be filled with a reverse-surface-protecting insulating film 18. Alternatively, the formation of the depression can be prevented by appropriately controlling the conditions during the formation of the second metal film 19B. The reverse-surface-protecting insulating film 18 can be formed by a polyimide resin, an epoxy resin, a phenol resin, or the like. The substrate 11 serves to provide insulation between the reverse surface and the circuit board 50. Thus, the insulation between the reverse surface of the substrate 11 and the circuit board 50 may be provided by providing a gap between the reverse surface of the substrate 11 and the circuit board 50, mounting a semiconductor chip 10 on the circuit board 50 and then filling the gap between the substrate 11 and the circuit board 50 with a resin material, or providing an insulating film on the side of the circuit board 50. In the example illustrated in FIGS. 2A to 3B, the surface of the circuit board 50 is covered with a solder resist 53.

The semiconductor chip of the present embodiment includes the connection electrode 20, and the connection electrode 20 and the penetrating plug 21 are connected together. However, it is only required that the penetrating electrode is electrically connected to the internal wiring 22, and it is not always necessary to form the connection electrode 20. Where the connection electrode 20 is formed, an insulating film 17 for protecting the surface where the connection electrode 20 is to be formed may be provided with an opening through which the connection electrode 20 is exposed, whereby the probe inspection can be performed by using the connection electrode 20. Moreover, the formation of the penetrating plug 21 directly under the connection electrode 20 does not deteriorate the area efficiency. The insulating film 17 can be formed of a polybenzoxazol (PBO) resin, a polyimide resin, or the like.

Since the semiconductor chip 10 of the present embodiment is an image-sensing chip, a light-collecting microlens 14 is formed in the light-receiving element region 11A. A transparent member 42 is provided over the entire area of the front surface, including the microlens 14, by a transparent adhesive 43 therebetween. If the transparent member 42 covers not only the light-receiving element region 11A but also the peripheral region 11B, it is possible to protect not only the light-receiving element region 11A but also the peripheral region 11B, thereby improving the mechanical strength.

If the peripheral region 11B is covered with the transparent member 42, heat generated at the amplifier element 30 less easily diffuses above the substrate 11. This nevertheless will not create a problem as the semiconductor chip of the present embodiment is provided with the heat-radiating plug 31.

Where the probe inspection is performed by using the connection electrode 20, there will be minute depressions/protrusions due to probing on the surface of the connection electrode 20. The minute depressions may catch bubbles therein, and such bubbles may remain between the transparent adhesive 43 and the connection electrode 20. With the semiconductor chip of the present embodiment, however, the transparent member 42 covers substantially entirely the front surface with the transparent adhesive 43 therebetween, whereby there is little influence of bubbles on the connection electrode 20, and the peeling of the transparent adhesive 43 can be reduced. Therefore, the distance from the connection electrode 20 to the light-receiving element region 11A doe not have to be very long, thereby allowing the overall package size to be reduced.

The transparent member 42 may be, for example, a low-pass filter of a borosilicate glass plate, or a crystal plate or a calcite plate having birefringence characteristics so as to prevent moiré due to interference fringes in a particular direction. Alternatively, the transparent member 42 may be a low-pass filter obtained by attaching quartz plates or calcite plates on both sides of an infrared cutting filter so that birefringence characteristics thereof are orthogonal to each other. Alternatively, the transparent member 42 may be a transparent epoxy resin plate, a transparent acrylic resin plate, a transparent alumina plate, or the like. It is preferred that the transparent member 42 gives a transmittance of 90% or more to incident light having a wavelength of 500 nm. Moreover, the semiconductor chip 10, including the transparent member 42 and the transparent adhesive 43, preferably has a small height. For this, the thickness of the transparent member 42 is preferably as thin as possible. However, the transparent member 42 being too thin cannot protect the image-sensing chip. It also makes the manufacturing process more difficult. Therefore, where a borosilicate glass plate is used as the transparent member 42, for example, the thickness should be 200 μm to 1000 μm, preferably 300 μm to 700 μm. Where the transparent member 42 is alumina or a transparent resin, the thickness needs to be determined taking into consideration the transmittance of the particular transparent member 42. With crystal and calcite, the interval between double images occurring due to birefringence, in addition to the transmittance, is related to the thickness of the transparent member 42, and the thickness therefore needs to be determined taking into consideration the interval between pixels of the image-sensing chip.

The transparent adhesive 43 is an optically transparent adhesive used for bonding the transparent member 42 over the light-receiving element region 11A. For example, the transparent adhesive 43 may be, for example, an acrylic resin, an epoxy resin or a polyimide resin mixed with another resin that has no absorption edge within the visible wavelength range. The transparent adhesive 43 may be an adhesive that can be cured by UV irradiation, heat, or a combination thereof. It is also preferred that the transparent adhesive 43 when cured has a lower refractive index than that of the microlens 14.

The present embodiment is directed to a semiconductor chip being an image-sensing chip including the light-receiving element 13. However, the heat-radiating structure and the heat-radiating means illustrated in the present embodiment are not limited to image-sensing chip applications, but may be applicable to any semiconductor chip such as a memory chip, a logic chip, a controller chip and a light-emitting chip. Then, the semiconductor element for which the heat-radiating plug 31 is formed is not limited to an amplifier element. The heat-radiating plug 31 may be formed under any semiconductor element generating a large amount of heat.

The material of the substrate 11 is not limited to silicon, but may be germanium used in a low-power consumption, high-frequency semiconductor device, or a group III-V compound, a group II-VI compound, or the like, used in a semiconductor laser, a light emitting diode, or the like. Alternatively, the material of the substrate 11 may be an insulator such as sapphire.

Each of the internal wiring 22 and the reverse surface wiring 23 preferably has a large line width, and may be of multiple lines. A plurality of connection terminals 25 may be formed in a single reverse surface electrode, and a plurality of heat-radiating terminals 35 may be formed in a single metal layer 33. With such a structure, it is possible to reduce the heat resistance against heat radiation. A group of wires, a metal film region, or the like, may be formed on the reverse surface of the substrate 11, separately from the reverse surface wiring 23 and the metal layer 33, and the metal film region, or the like, may be connected to the circuit board via a connection terminal. Then, it is possible to further improve the heat-radiating capability of the semiconductor chip 10. If a metal film region, or the like, is grounded, an electrical shielding effect can also be expected.

As described above, the present invention realizes a semiconductor chip capable of efficiently radiating heat from the reverse surface of the semiconductor substrate, and is therefore particularly useful as a semiconductor chip including heat-generating amplifier elements, or the like, and as a semiconductor device, or the like, using the same.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A semiconductor chip, comprising:
   a substrate having a front surface and a reverse surface opposite to the front surface;
   an integrated circuit disposed in the front surface of the substrate, the integrated circuit including a plurality of semiconductor elements;
   a first penetrating plug penetrating from the reverse surface of the substrate to a middle of the substrate so that the first penetrating plug is disposed apart from the front surface of the substrate;
   a second penetrating plug penetrating from the reverse surface of the substrate to the front surface of the substrate, wherein:
   an area of a portion of the first penetrating plug that is exposed on the reverse surface is smaller than an area of a portion of the second penetrating plug that is exposed on the reverse surface.

2. The semiconductor chip of claim 1, further comprising a first insulating film disposed between the first penetrating plug and the substrate.

3. The semiconductor chip of claim 2, further comprising:
   a metal layer disposed on the reverse surface and connected to the first penetrating plug; and
   a second insulating film formed between the reverse surface and the metal layer.

4. The semiconductor chip of claim 1, wherein the first penetrating plug is made of a metal material including copper.

5. The semiconductor chip of claim 1, wherein:
   the substrate has a center portion and a periphery portion surrounding the center portion in a plan view,
   an area of the periphery portion is smaller than that of the center portion, and
   the first penetrating plug is disposed in the periphery portion.

6. The semiconductor chip of claim 1, wherein:
   the first penetrating plug has an inner side surface and an inner bottom surface being opposed to the reverse surface, the first penetrating plug has a first metal film, the first metal film has a first depression in a region corresponding to the first penetrating plug, a first distance between the inner bottom surface of the first penetrating plug and the first depression is longer than a second distance between the inner side surface of the first penetrating plug and the first depression.

7. The semiconductor chip of claim 1, wherein:

the substrate has a center portion and a periphery portion surrounding the center portion in a plan view, an area of the periphery portion is smaller than that of the center portion, and the second penetrating plug surrounds the center portion.

8. The semiconductor chip of claim 1, wherein:

the second penetrating plug has an inner side surface and an inner bottom surface being opposed to the reverse surface, the second penetrating plug has a second metal film, the second metal film has a second depression in a region corresponding to the second penetrating plug, and a first distance between the inner bottom surface of the second penetrating plug and the second depression is longer than a second distance between the inner side surface of the second penetrating plug and the second depression.

9. A semiconductor chip, comprising:

a substrate having a front surface and a reverse surface opposite to the front surface;

an integrated circuit disposed in the front surface of the substrate, the integrated circuit including a plurality of semiconductor elements;

a first penetrating hole having a inner side surface and a inner bottom surface being opposed to the reverse surface, the first penetrating hole penetrating from the reverse surface of the substrate to a middle of the substrate so that the inner bottom surface of the first penetrating hole is apart from the front surface of the substrate; and a first metal film disposed in the first penetrating hole, wherein the first metal film has a first depression in a region corresponding to the first penetrating hole.

10. The semiconductor chip of claim 9, further comprising an insulating film disposed on the reverse surface and extending from the reverse surface to the inner side surface.

11. The semiconductor chip of claim 9, wherein a first distance between the inner bottom surface of the first penetrating hole and the first depression is longer than a second distance between the inner side surface of the first penetrating hole and the first depression.

12. The semiconductor chip of claim 9, further comprising:

a second penetrating hole having a inner side surface and a inner bottom surface being opposed to the reverse surface, the second penetrating hole penetrating from the reverse surface of the substrate to the front surface of the substrate; and a second metal film disposed in the second penetrating hole, wherein the second metal film has a second depression in a region corresponding to the second penetrating hole.

13. The semiconductor chip of claim 12, wherein a first distance between the inner bottom surface of the second penetrating hole and the second depression is longer than a second distance between the inner side surface of the second penetrating hole and the second depression.

14. A semiconductor chip, comprising:

a substrate having a front surface and a reverse surface opposite to the front surface;

an integrated circuit disposed in the front surface of the substrate, the integrated circuit including a plurality of semiconductor elements;

a first penetrating hole having an inner side surface and an inner bottom surface being opposed to the reverse surface, the first penetrating hole penetrating from the reverse surface of the substrate to a middle of the substrate so that the inner bottom surface of the first penetrating hole is apart from the front surface of the substrate; and a first metal film disposed in the first penetrating hole, wherein a diameter of the first penetrating hole is smaller than a height of the first penetrating hole.

15. The semiconductor chip of claim 14, further comprising an insulating film disposed on the reverse surface and extending from the reverse surface to the inner side surface.

16. The semiconductor chip of claim 14, wherein:

the first metal film has a first depression in a region corresponding to the first penetrating hole, and a first distance between the inner bottom surface of the first penetrating hole and the first depression is longer than a second distance between the inner side surface of the first penetrating hole and the first depression.

17. The semiconductor chip of claim 14, wherein the substrate has a center portion and a periphery portion surrounding the center portion in a plan view, an area of the periphery portion is smaller than that of the center portion, and the first penetrating hole is disposed in the periphery portion.

18. The semiconductor chip of claim 14, further comprising a second penetrating plug penetrating from the reverse surface of the substrate to the front surface of the substrate, wherein:

the substrate has a center portion and a periphery portion surrounding the center portion in a plan view, an area of the periphery portion is smaller than that of the center portion, and the second penetrating plug surrounds the center portion.

19. The semiconductor chip of claim 14, further comprising:

a second penetrating hole having a inner side surface and a inner bottom surface being opposed to the reverse surface, the second penetrating hole penetrating from the reverse surface of the substrate to the front surface of the substrate; and a second metal film disposed in the second penetrating hole, wherein the second metal film has a second depression in a region corresponding to the second penetrating hole.

20. The semiconductor chip of claim 19, wherein a first distance between the inner bottom surface of the second penetrating hole and the second depression is longer than a second distance between the inner side surface of the second penetrating hole and the second depression.

21. A semiconductor chip, comprising:

a semiconductor substrate having a front surface and a reverse surface opposite to the front surface;

an integrated circuit disposed in the front surface of the substrate; and a heat-radiating plug disposed in a first penetrating hole penetrating from the reverse surface of the semiconductor substrate to a middle of the semiconductor substrate so that an inner bottom surface of the first penetrating hole is apart from the front surface of the semiconductor substrate.

* * * * *